US006544867B1

(12) United States Patent
Webb et al.

(10) Patent No.: US 6,544,867 B1
(45) Date of Patent: Apr. 8, 2003

(54) MOLECULAR BEAM EPITAXY (MBE) GROWTH OF SEMI-INSULATING C-DOPED GAN

(75) Inventors: James Brian Webb, Manotick (CA); Haipeng Tang, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/589,756

(22) Filed: Jun. 9, 2000

Related U.S. Application Data

(60) Provisional application No. 60/138,583, filed on Jun. 11, 1999.

(51) Int. Cl.[7] .............................................. H01L 21/76
(52) U.S. Cl. ........................ 438/478; 438/191; 438/479
(58) Field of Search ........................... 257/627, 82, 85, 257/90, 96, 46; 438/16, 23, 114, 465, 454, 958, 478, 191, 192, 194, 195; 372/44, 43, 479

(56) References Cited

U.S. PATENT DOCUMENTS

| 5,284,394 A | * | 2/1994 | Lemelson ................... 384/463 |
| 5,344,948 A | * | 9/1994 | Verkade ....................... 556/51 |
| 5,385,862 A | * | 1/1995 | Moustakas .................. 437/107 |
| 5,398,641 A | | 3/1995 | Shih |
| 5,464,656 A | * | 11/1995 | Verkade ....................... 427/248 |
| 5,602,418 A | * | 2/1997 | Imai et al. ................... 257/627 |
| 5,657,335 A | * | 8/1997 | Rubin et al. ................. 372/44 |
| 5,786,233 A | | 7/1998 | Taskar et al. |
| 5,976,412 A | | 11/1999 | Itoh et al. |
| 6,080,668 A | * | 6/2000 | Lauffer et al. .............. 438/666 |
| 6,291,318 B1 | * | 9/2001 | Webb et al. ................. 438/479 |

FOREIGN PATENT DOCUMENTS

| EP | 0540304 | 10/1992 |
| EP | 0977278 | 7/1999 |
| JP | 2134387 | 5/1990 |
| JP | 5121327 | 5/1991 |
| JP | 9063962 | 3/1997 |
| JP | 10112438 | 4/1998 |
| JP | 11026383 | 3/1999 |
| JP | 11163334 | 6/1999 |
| JP | 11233827 | 8/1999 |

* cited by examiner

*Primary Examiner*—Tuan H. Nguyen
*Assistant Examiner*—Laura M Schillinger
(74) *Attorney, Agent, or Firm*—Marks & Clerk

(57) ABSTRACT

A method of growing semi-insulating GaN epilayers by ammonia-molecular beam epitaxy (MBE) through intentional doping with carbon is described. Thick GaN layers of high resistivity are an important element in GaN based heterostructure field-effect transistors. A methane ion source is preferably used as the carbon dopant source.

12 Claims, 2 Drawing Sheets

(b)

(a)

(b)

MOLECULAR BEAM EPITAXY (MBE) GROWTH OF SEMI-INSULATING C-DOPED GAN

This application claims the benefit of Provisional Application No. 60/138,583, filed Jun. 11, 1999.

FIELD OF THE INVENTION

This invention relates generally to the field of group III-V (group III-nitride) semiconductors, and in particular to a method of growing Gallium nitride (GaN) epilayers for use in electronic devices.

BACKGROUND OF THE INVENTION

Gallium nitride has strong potential for applications in high power, high frequency electronic devices due to its high electron saturation velocity, high critical field, and high stability. Moreover, the large band discontinuity and close lattice match between GaN and its ternary alloy AlGaN make it possible to form a high quality AlGaN/GaN hetero-interface that can confine an unusually high density of electrons in a two-dimensional electron gas. The high solubility of the AlGaN alloy and large piezoelectric field in the strained heterostructure allow extensive and sophisticated band structure engineering and tailoring for specific and optimal device performance. Modulation-doped field effect transistors (MODFETs) based on the AlGaN/GaN heterostructures; have been demonstrated to show very promising high frequency, high power, and high temperature performance.

Two growth techniques, namely metal-organic chemical vapor deposition (MOCVD) and molecular beam epitaxy (MBE), have been successful in growing these high quality MODFET structures. Though both techniques have yielded devices with similar performance, the MOCVD grown AlGaN/GaN heterostructures have shown a higher mobility of the two-dimensional electron gas, which is typically about 1000–1200 $cm^2$/Vs at room temperature for growth on sapphire substrates and up to about 2000 $cm^2$/Vs for growth on SiC substrates.

One of the key requirements in the growth of GaN MODFETs is the growth of a thick semi-insulating GaN layer. The GaN layer has to be thick enough (usually>1 micron) in order for the AlGaN/GaN interface to avoid the highly defective region near the GaN/substrate interface caused by the lattice mismatch. Meanwhile, the GaN layer needs to be highly resistive. A conducting GaN buffer layer will cause leakage current and degradation of r.f. performance of the device.

However, little is known about growing the highly resistive GaN layer. Even less is understood about the physical origin of the semi-insulating property of the GaN layers grown for the MODFETs.

Using an MSE deposited AMN nucleation layer, it is possible to grow high quality Si-doped GaN bulk layers with record high mobilities (up to 560 $cm^2$/Vs for a carrier density of $1.4\times10^{17}$ $cm^{-3}$ at room temperature) for the MBE technique. It is however surprisingly difficult to grow highly resistive GaN by ammonia-MBE since the undoped layers tend to acquire an autodoping concentration typically in the range of $10^{16}$ to $10^{18}$ $cm^{-3}$, depending on the growth conditions. This autodoping can be eliminated by using certain growth conditions, such as a lower growth temperature and/or low III to V ratio, which could introduce acceptor-type defects to compensate for the n-type carriers. However, this approach requires using non-optimal growth conditions and suffers from poor reproducibility. The applicants have been unable to produce truly high resistivity undoped GaN layers by varying growth temperature and III/IV ratio in such a system. The highest resistivity achieved was about 500 Ω-cm and was not reproducible. An object of the invention is to provide a method of growing semi-insulating GaN.

SUMMARY OF THE INVENTION

According to the present invention there is provided a method of making a device with a semi-insulating GaN layer, comprising growing said semi-insulating gallium nitride layer using molecular beam epitaxy (MBE) in the presence of a nitrogen source and carbon dopant.

MBE is a technique for laying down layers of these materials with atomic thicknesses on to substrates. This is done by creating a molecular beam of a material, gallium in this case, which impinges on to the substrate and then reacting with the ammonia to create epitaxial layers of GaN.

Carbon is an acceptor in GaN when substituting the nitrogen site. It is the only group IV element that has a small enough atomic radius to enter the nitrogen site. Compared with other group II acceptors such as Mg and Ca, carbon is much less volatile and therefore not prone to causing a residual memory effect in the growth system. It is therefore a good compensating dopant for achieving semi-insulating GaN.

In a preferred embodiment, methane gas injected into a saddle field ion gun is used for the carbon dopant source. Other plasma sources such RF and ECR can be employed.

Control of the doping level is achieved by adjusting parameters of the ion source, such as the ion kinetic energy (anode voltage) and the ion current. Semi-insulating C-doped GaN layers with resistivities greater than $10^8$ Ω-cm have been obtained with high reproducibility and reliability. Using the C-doped semi-insulating GaN as a thick buffer layer, high quality AlGaN/GaN heterostructures which exhibited a two-dimensional electron gas with high mobility have successfully been grown. The highest room temperature mobility achieved so far is 1210 $cm^2$/Vs with a corresponding 77K mobility of 5660 $cm^2$/Vs. These mobility values are believed to be the highest reported for a two-dimensional electron gas grown by MBE, and are comparable to the best mobilities reported for AlGaN/GaN heterostructures grown by MOCVD on sapphire substrates and can be compared to values of 1150 $cm^2$/Vs and 3440 $cm^2$/Vs at 300K and 77K recently reported for N-face structures and 1190 $cm^2$/Vs at 300K for the Ga-face structures grown by plasma source MBE. More importantly, the high mobility heterostructures can be grown on a truly insulating GaN base, allowing practical device fabrication using these structures.

The invention also provides an apparatus for growing a semi-insulating GaN layer, comprising a vacuum chamber for supporting a substrate, a gallium beam source directed at said substrate, a source of nitrogen, and a source of carbon ions directed at said substrate.

BRIEF DESCRIPTION OF THE DRAWINGS

The invention will now be described, by way of example only, with reference to the accompanying drawings, in which.

DETAILED DESCRIPTION OF THE INVENTION

EXAMPLE

Figure 3:
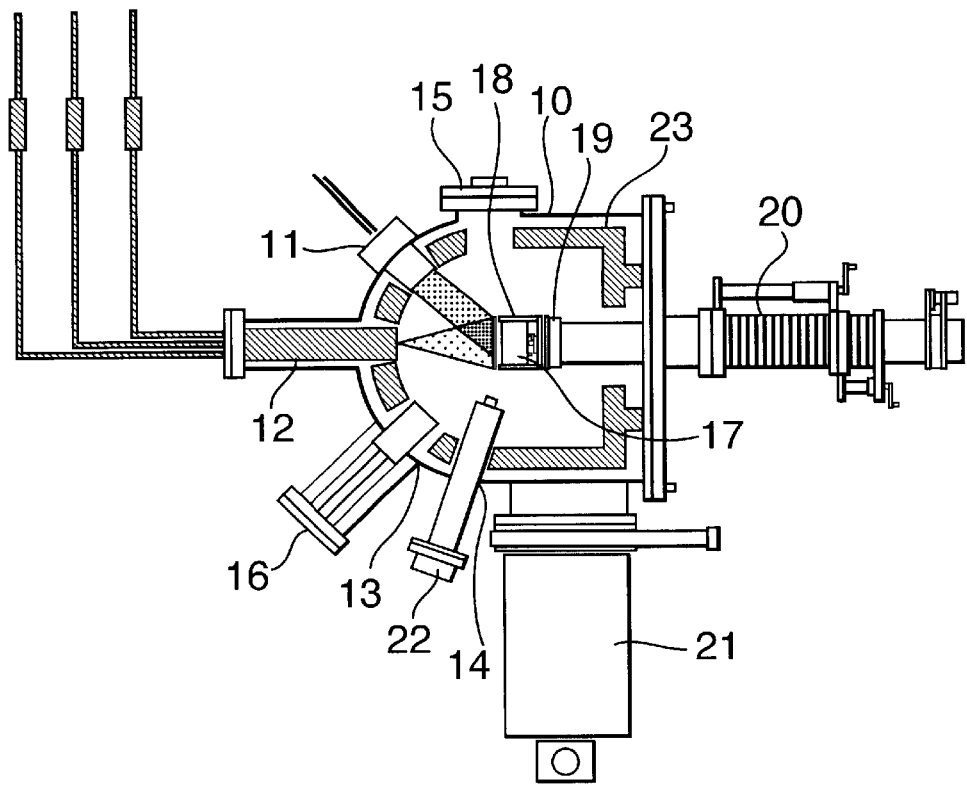
FIG. 3 is a diagram showing a suitable molecular beam source with saddle field ion source.

GaN layers were grown in a custom built system equipped for both molecular beam epitaxy (MBE) and magnetron sputter epitaxy (MSE). The equipment is shown in FIG. 3 and comprises a vacuum chamber 10 having ports 11, 12, 13, 14 and 15.

The gallium beam originates from a K cell 16 mounted in port 13. Ammonia gas enters the vacuum chamber 10 through port 12. Carbon ions are generated from a methane gas stream in port 11, which includes an Ion Tech saddle field ion source for cracking the methane and generating carbon ions.

The gallium nitride layer grows on a substrate 17, for example of sapphire or silicon carbide, within heater 18 and mounted on a support 19, which can be rotated with the aid of a manipulator 20.

The vaccum chamber 10 is evacuated with the aid of a cryopump 21. Residual gas analyser 22 in port 14 permits analysis of the gas within the chamber 10. The substrate is surrounded by cold shroud 23 cooled with liquid nitrogen.

In the MSE technique, a UHV, D.C. magnetron sputter target was used as the group III source and ammonia as the nitrogen source. The MSE technique was employed only for depositing a thin AlN nucleation layer, while the GaN and AlGaN layers were grown by MBE using ammonia as the nitrogen source. Two inch (0001) sapphire wafers were used as substrates for all growths.

In the specific example, methane was used as the source material for carbon, although other carbon-containing compounds in the gaseous phase, such as carbon tetrabromide, etc can be used. Carbon could not be incorporated when methane was directly supplied to the growing film surface. Even for a large flow of methane of 1 to 10 sccm, carbon was not detected in the films by secondary ion mass spectroscopy (SIMS). The resulting films still showed a high n-type conductivity. Apparently, thermal cracking at the substrate was insufficient to induce carbon incorporation.

The saddle field ion gun in port 11 was used to help crack methane. The ion source provided a low energy ion flux with kinetic energy controllable by an extraction anode voltage between 0 and 1000 V. Using the methane ion source, semi-insulating C-doped GaN layers were grown at the same temperature and ammonia flux as those used for the growth of high mobility n-type GaN, which are typically 910° C. and 50 sccm respectively. (thermocouple temperature was also 910° C.). All temperature values were measured with a pyrometer with emissivity set to 0.3. Thus there may be an offset with the growth temperatures reported in other studies if the emissivity was set differently. The ion source was set to provide a 200 eV ion energy for a methane flow of about 1 sccm. The resistivity was measured using a Van der Pauw geometry.

Measured values were typically in the range of $10^6$ to $10^8$ Ω-cm. The crystallinity of the C-doped layers was somewhat lower than the optimized undoped layers, apparently due to significant carbon incorporation. For a 1.5 $\mu$m thick C-doped layer, the (0002) X-ray rocking curve FWHM was about 500 to 600 arcsec, compared with values of about 300 to 400 arcsec for the best undoped or Si-doped layers. Nevertheless, the C-doped GaN layer, used as a thick insulating buffer, enabled the growth of excellent-quality MODFET structures comprising of a heterostructure formed between a high quality undoped GaN channel layer and an AlGaN barrier layer. Theoretical calculations find that carbon can be a donor or an acceptor in GaN, depending on whether it takes the cation or the anion site. C(cation) and C(anion) have a strong tendency to form nearest neighbours, leading to self-compensation.

Figure 1:
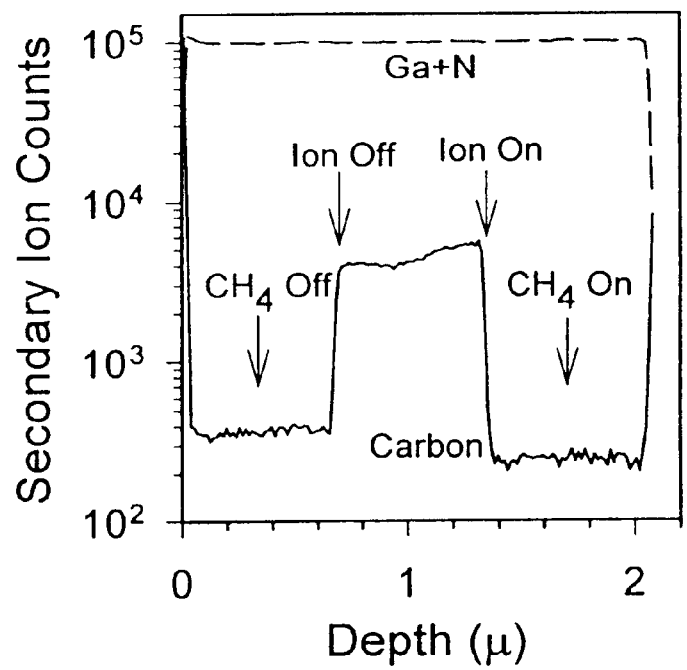
FIG. 1a is a SIMS carbon profile as a function of depth from the surface of an epilayer for a sample grown with fixed carbon ion energy and with the methane flow and the ion gun turned on and off during the growth.
FIG. 1b is a profile for a sample grown with various anode voltages of the ion source (The film growth is from right to left in the figure)
Figure 1:
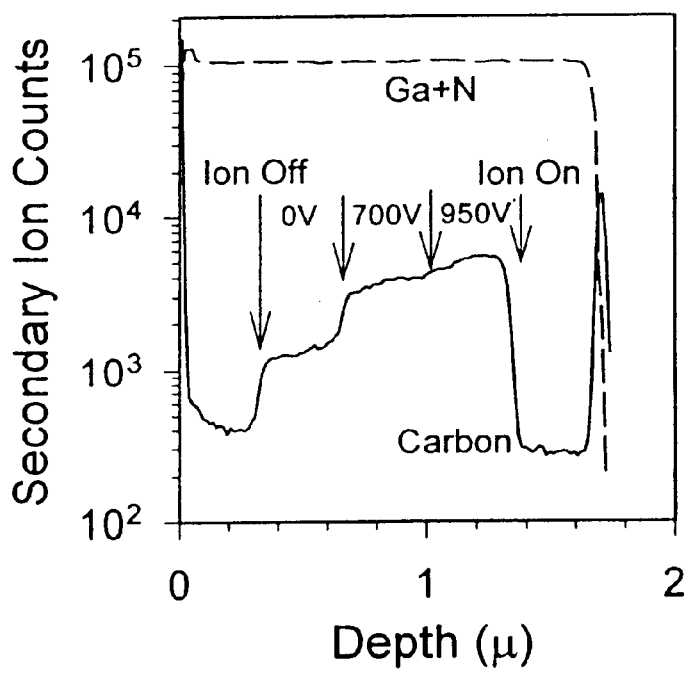

FIG. 1(a) shows the measured SIMS profile of a GaN layer for which the methane flow and the ion gun have been turned on and off during growth. It can be seen that methane alone did not result in any detectable carbon incorporation without first being cracked by the ion source. Significant incorporation of carbon occurred when the ion source was turned on.

FIG. 1(b) shows the SIMS profile of a GaN sample for which the ion energy parameter (anode voltage) of the ion source has been decreased in steps during the growth. The maximum carbon density shown in the Figure is estimated to be $1 \times 10^{28}$ cm$^{-3}$ based on the known background carbon concentration of the SIMS machine. It can be seen that the efficiency of carbon incorporation is dependent on the ion kinetic energy. Note that for zero anode voltage the plasma discharge in the saddle field source remains on and carbon neutrals and ions can still diffuse out. Characteristics of C incorporation with other types of plasma sources such as an RF or ECR sources are expected to fall into the general category as described.

AlGaN/GaN heterostructure samples were grown in the following sequence. First a 200 Å AlN nucleation layer was deposited at 880° C. by MSE under 40 sccm Ar and 15 sccm ammonia. Then a 2 $\mu$m C-doped GaN was grown at 910° C. by MBE using 50 sccm ammonia and 200 eV ion energy for a methane flow of 1 sccm, followed by 2000 Å of undoped GaN grown under the same conditions except the carbon source. A 130 Å AlGaN barrier layer was then grown at the same temperature and ammonia flow rate. The AlGaN barrier was also undoped, with a nominal Al content varied between 10 and 30% for the samples studied. The heterostructures grown exhibited a two-dimensional electron gas characterized by a nearly constant, temperature independent carrier concentration and correspondingly high room temperature and low temperature mobilities. The parameters given are exemplary only. All variables may be changed within limits apparent to one skilled in the art.

Figure 2:
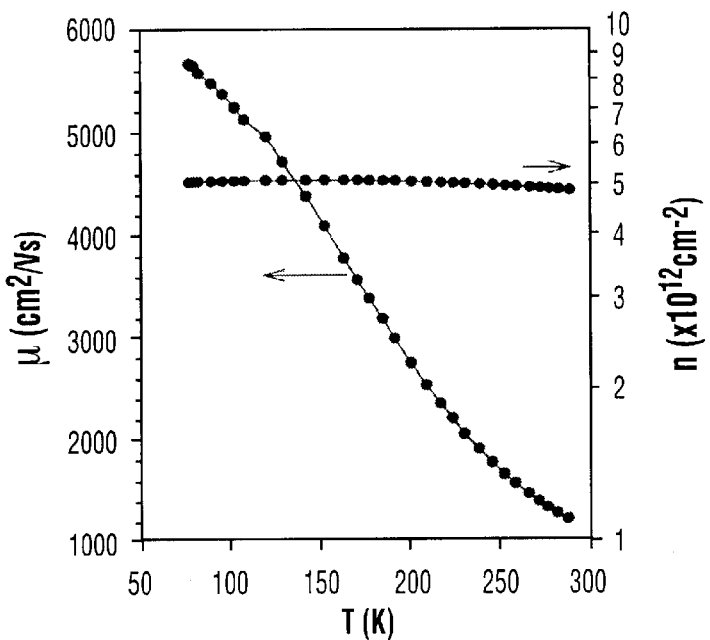
FIG. 2 shows the Hall effect mobility and carrier density for a high mobility AlGaN/GaN 2D electron gas on (0001) sapphire substrate for temperatures in the range 77K≦T≦300K.

FIG. 2 shows the temperature dependence of the Hall effect measurement on a 5 mm.×5 mm. sample using the Van der Pauw method. The mobility is above 1200 cm$^2$/Vs at room temperature and reaches 5660 cm$^2$/Vs at 77 K. The mobility has not yet saturated and continues to increase for further decreasing temperature. The carrier density remains almost constant with a change of less than 3% between 77 K and room temperature. The insulating property of the thick GaN base is the key to eliminating parallel conduction through the bulk GaN layer. In some reports on AlGaN/GaN twodimensional electron gases, a significant drop of in carrier density with decreasing temperature was observed, which is an indication of parasitic conduction in the bulk GaN buffer layer. Since the AlGaN barrier was not doped in the samples studied, the two-dimensional electron gas at the AlGaN/GaN interface could be induced mainly by piezoelectric effects. Indeed, a higher carrier density was found in samples with a higher Al content in the AlGaN barrier, as can be see in Table I, which gives the carrier density and mobility values of a few AlGaN/GaN samples studied. It can be seen that the room temperature mobility values are similar for all the samples, but the mobility at 77 K is significantly higher in samples with lower carrier density (or lower Al content).

TABLE 1

Sheet carrier density and mobility values at room temperature and 77K for a number of 2D electron gas samples.

| Sample | Al Content (%) | $n(10^{12} cm^{-2})$ | $\mu(cm^2/Vs)$ 300K | $\mu(cm^2/Vs)$ 77K |
|---|---|---|---|---|
| 1 | ~30 | 19.4 | 930 | 2050 |
| 2 | ~30 | 18.0 | 1050 | 2600 |
| 3 | ~30 | 15.4 | 1174 | 3040 |
| 4 | ~15 | 7.2 | 1060 | 3260 |
| 5 | ~10 | 4.9 | 1211 | 5660 |

The present results provide evidence that carbon is a deep acceptor and acts as a source of compensation in n-type or semi-insulating GaN.

The cracking of the methane gas by the ion source was found to be the key to the effective incorporation of carbon. High quality C-doped GaN layers with resistivities greater than $10^6$ $\Omega$-cm have been grown with high reproducibility and reliability. AlGaN/GaN heterostructures grown on the C-doped semi-insulating GaN base layers exhibited a high mobility two dimensional electron gas at the heterointerface, with room temperature mobilities typically between 1000 and 1200 $cm^2/Vs$, and liquid nitrogen temperature mobilities up to 5660 $cm^2/Vs$. The carrier density was almost constant, with less than 3% change over the measured temperature range.

The present invention permits the growth of high quality, semi-insulating C-doped GaN by ammonia MBE using a methane ion source for the dopant, and the growth of high mobility AlGaN/GaN heterostructures using C-doped insulating GaN base layers. The high mobility results represent important progress for the MBE technique in growing high quality AlGaN/GaN heterostructures, with implications for further enhancement of the performance of MBE grown MODFETs.

We claim:

1. A method of making a device with a semi-insulating gallium nitride layer, comprising:

providing a substrate in a vacuum chamber of a molecular beam epitaxy apparatus;

introducing a gaseous carbon-containing compound into said vacuum chamber as a source of carbon, cracking said carbon-containing compound with a plasma source to generate carbon ions;

growing said gallium nitride layer on said substrate by molecular beam epitaxy in the presence of a nitrogen source and said carbon ions to incorporate said carbon into said gallium nitride layer as a deep acceptor dopant; and controlling the doping level of said carbon to produce said semi-insulating gallium nitride layer.

2. A method as claimed in claim 1, wherein the nitrogen source is selected from the group consisting of: ammonia and nitrogen.

3. A method as claimed in claim 1, wherein said carbon ions are generated with a saddle field ion gun.

4. A method as claimed in claim 1, wherein said gallium nitride layer is grown on an AlN or GaN nucleation layer.

5. A method as claimed in claim 4, wherein said nucleation layer is formed using a technique selected from the group consisting of: magnetron sputter epitaxy and molecular beam epitaxy.

6. A method as claimed in claim 5, wherein said nucleation layer is formed on a wafer selected from the group consisting of: sapphire, SiC and GaN.

7. A method as claimed in claim 1, wherein said device comprises an AlGaN/GaN heterostucture, and comprising growing an AlN nucleation layer on said substrate prior to growing said gallium nitride layer, after growing said gallium nitride layer growing a further gallium nitride layer under the same conditions as said first-mentioned gallium nitride layer except for the absence of said carbon ions, and growing an AlGaN layer on said further gallium nitride layer.

8. A method as claimed in claim 7, wherein said AlN nucleation layer is grown at 880° C. by MBE under about 40 sccm Ar and about 15 sccm ammonia.

9. A method as claimed in claim 8, wherein the first-mentioned gallium nitride layer is grown at a temperature of about 910° C. by MBE using about 50 sccm ammonia and about 200 eV ion energy with a methane flow of about 1 sccm.

10. A method as claimed in claim 1, wherein said doping level is controlled by adjusting parameters of said plasma source.

11. A method as claimed in claim 1, wherein said semi-insulating layer is at least one micron thick.

12. A method of making a device with a semi-insulating gallium nitride layer, comprising:

providing a substrate in a vacuum chamber of a molecular beam epitaxy apparatus;

introducing methane gas into said vacuum chamber as a source of carbon;

cracking said methane gas with a saddle field ion gun source to generate carbon ions;

growing said gallium nitride layer on said substrate by molecular beam epitaxy in the presence of a nitrogen source and said carbon ions to incorporate said carbon into said gallium nitride layer as a deep acceptor dopant; and controlling the doping level of said carbon to produce said semi-insulating gallium nitride layer.

* * * * *